(12) United States Patent
Honer et al.

(10) Patent No.: US 8,269,319 B2
(45) Date of Patent: Sep. 18, 2012

(54) COLLECTIVE AND SYNERGISTIC MRAM SHIELDS

(75) Inventors: Kenneth Allen Honer, Santa Clara, CA (US); Guilian Gao, San Jose, CA (US); William Walter Carlson, San Jose, CA (US); Michael Warner, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/973,869

(22) Filed: Oct. 10, 2007

(65) Prior Publication Data

US 2008/0122047 A1    May 29, 2008

Related U.S. Application Data

(60) Provisional application No. 60/851,646, filed on Oct. 13, 2006.

(51) Int. Cl.
*H01L 23/552* (2006.01)
(52) U.S. Cl. ......................... 257/659; 257/660
(58) Field of Classification Search .................. 257/660, 257/659, 422
See application file for complete search history.

(56) References Cited

U.S. PATENT DOCUMENTS

| | | | |
|---|---|---|---|
| 4,922,606 A * | 5/1990 | Alexander et al. .............. | 29/839 |
| 5,902,690 A | 5/1999 | Tracy et al. | |
| 6,429,044 B1 * | 8/2002 | Tuttle ............................. | 438/106 |
| 6,509,621 B2 | 1/2003 | Nakao et al. | |
| 6,515,352 B1 | 2/2003 | Spielberger et al. | |
| 6,559,521 B2 * | 5/2003 | Tuttle ............................. | 257/659 |
| 6,664,613 B2 | 12/2003 | Tuttle | |
| 6,717,241 B1 | 4/2004 | Tuttle | |
| 6,724,027 B2 | 4/2004 | Bhattacharyya et al. | |
| 6,808,940 B2 | 10/2004 | Sharma et al. | |
| 6,867,468 B2 | 3/2005 | Sharma et al. | |
| 6,872,993 B1 | 3/2005 | Zhu et al. | |
| 6,929,957 B2 * | 8/2005 | Min et al. ........................ | 438/3 |
| 7,119,419 B2 | 10/2006 | Kato et al. | |
| 7,166,479 B2 | 1/2007 | Zhu et al. | |
| 2001/0024345 A1 * | 9/2001 | Narumi et al. ................. | 360/319 |
| 2002/0050632 A1 | 5/2002 | Tuttle | |
| 2002/0105058 A1 | 8/2002 | Tuttle | |
| 2003/0052340 A1 | 3/2003 | Tuttle | |
| 2003/0197211 A1 | 10/2003 | Bhattacharyya et al. | |
| 2004/0032010 A1 * | 2/2004 | Kools et al. .................... | 257/659 |
| 2004/0043516 A1 | 3/2004 | Sharma et al. | |
| 2004/0043519 A1 | 3/2004 | Sharma et al. | |
| 2004/0126905 A1 | 7/2004 | Bhattacharyya et al. | |
| 2004/0233641 A1 * | 11/2004 | Moshayedi ..................... | 361/716 |

(Continued)

OTHER PUBLICATIONS

Gao and Honer, "Magnetic Shielding for Stacked MRAM Packages", Camstar: Your Business is Global. Why Isn't Your Manufacturing Software, Semidconductor International, Dec. 1, 2006, 9 pages.

*Primary Examiner* — Wael Fahmy
*Assistant Examiner* — Bilkis Jahan
(74) *Attorney, Agent, or Firm* — Lerner, David, Littenberg, Krumholz & Mentlik, LLP (57) ABSTRACT

Various structures chip packages are disclosed including a magnetoresistive random access memory ("MRAM") device and a magnetic shield structure. The magnetic shield structure may be made from material having either ferromagnetic or diamagnetic material and may be shaped and incorporated into the chip package to divert stray magnetic fields away from the MRAM device.

27 Claims, 9 Drawing Sheets

U.S. PATENT DOCUMENTS

| | | |
|---|---|---|
| 2005/0045998 A1 | 3/2005 | Kools et al. |
| 2005/0067676 A1* | 3/2005 | Mahadevan et al. .......... 257/659 |
| 2005/0116255 A1* | 6/2005 | Kato et al. .................... 257/200 |
| 2005/0133916 A1* | 6/2005 | Karnezos ...................... 257/738 |
| 2005/0207263 A1 | 9/2005 | Okayama et al. |
| 2005/0226030 A1 | 10/2005 | Kato et al. |
| 2005/0230788 A1* | 10/2005 | Kato et al. .................... 257/659 |
| 2006/0152309 A1* | 7/2006 | Mintchev et al. ............... 335/58 |
| 2006/0289970 A1 | 12/2006 | Gogl et al. |
| 2007/0012952 A1 | 1/2007 | Guo et al. |

* cited by examiner

COLLECTIVE AND SYNERGISTIC MRAM SHIELDS

BACKGROUND OF THE INVENTION

This application claims the benefit of the filing date of U.S. Provisional Patent Application No. 60/851,646 filed Oct. 13, 2006, the disclosure of which is incorporated herein by reference.

The following application includes the article Gao and Honer, "Magnetic Shielding for Stacked MRAM", *Semiconductor Packaging*, Dec. 1, 2006 which is incorporated by reference herein.

Magnetoresistive random access memory ("MRAM") is a form of computer memory which uses magnetic polarity to store data. The use of magnetic polarity is advantageous because it results in a non-volatile form of memory, which means that it does not necessarily require an electrical current to retain the data stored therein. A typical MRAM structure uses many individual cells, each formed of two layers of ferromagnetic material separated by a thin layer of an insulating material. Each cell is capable of storing one bit of memory, which is carried out by imparting either a positive or negative polarity to one of the two ferromagnetic layers, the other layer having a fixed polarity. Essentially, when the two plates have the same polarity, the cell represents either a one or a zero, according to typical methods for storing memory, a cell with plates of the opposite polarity representing the opposite.

The polarity of a cell is changed by using a series of bit and word traces. This is done by arranging the individual cells in an array of rows and columns lying in, for example, the X- and Y-directions in a plane. The bit traces and word traces overlie, respectively, the rows and columns of cells. In this arrangement, one bit line and one word line intersect at the location of each of the cells. In order to "write" data to a cell, currents are passed through the corresponding bit and word lines, inducing a magnetic field at the location of the cell. The writable ferromagnetic plate matches this magnetic field. When the induced magnetic field ceases, the writable plate maintains the field imparted on it. This is done for all of the cells in the array in a predetermined sequence, thereby writing data to be retained in the memory.

The tunnel magnetoresistance effect ("TMR") causes the resistance of the insulator between the plates to change depending on the state of the cell. Generally, the resistance of the insulator is higher when the polarity of the plates is different (or "antiparallel") than when the plates have the same polarity (parallel). This effect is used in reading data from the memory.

Due to the nature of the MRAM structure, the data stored therein is susceptible to being corrupted or destroyed by stray magnetic fields. Essentially, a stray magnetic field which encounters the memory array can change the polarity of one or more cells, thereby corrupting the memory therein. A strong enough field could conceivably change all of the cells to the same polarity, thereby erasing all of the data stored in the array.

SUMMARY

In accordance with an embodiment of the invention, a microelectronic component has a die having top and bottom surfaces and edges extending between the top and bottom surfaces defining an outer periphery. The die includes MRAM circuitry. A first magnetic shield can overlie the top surface. A second magnetic shield can overlie the bottom surface.

In accordance with another embodiment of the invention, a microelectronic assembly has a plurality of microelectronic subassemblies. Each subassembly includes a die and a magnetic shield. Each die has a first face, a second face remote from the first face and can include MRAM circuitry therein. The magnetic shield can include a ferromagnetic material. The magnetic shield can be mounted to the first face of the die and be adapted to divert stray magnetic field away from the MRAM circuitry. A plurality of support elements may support the plurality of microelectronic subassemblies in stacked relation to each other so that the dies overlie one another.

In accordance with one embodiment of the invention, a microelectronic assembly has a substrate having a first face and a second face remote from the first face. A first die including MRAM circuitry and can be mounted to the first face of the substrate. A second die including MRAM circuitry can be mounted to the second face of the substrate. Each of the first and second magnetic shields can have a major wall and a plurality of minor walls extending from the major wall to define a recess. The first die may be disposed within the recess of the first magnetic shield. The second die may be disposed within the recess of the second magnetic shield.

In accordance with yet another embodiment of the invention, an MRAM device can have an array of magnetic memory cells arranged in a plurality of rows and a plurality of columns. A plurality of electrically conductive traces may correspond to a respective one of the rows or one of the columns of the array of magnetic memory cells. A magnetic shielding layer may coat an exposed surface of each of the plurality of conductive traces.

In accordance with still another embodiment of the invention, a microelectronic assembly can include a substrate extending in first and second transverse directions defining a plane and a magnetic field sensor. At least one MRAM die may be conductively connected to the substrate. A first electromagnetic coil can be oriented in the first direction. A second electromagnetic coil can be oriented in the second direction. Control circuitry may be in electronic communication with the magnetic field sensor, the first electromagnetic coil and the second electromagnetic coil. The control circuitry can be operable in response to output representing a magnetic field sensed by the magnetic field sensor and can control the first and second electromagnetic coils to generate an opposite magnetic field for neutralizing the sensed magnetic field.

BRIEF DESCRIPTION OF THE DRAWINGS

Embodiments will be better understood on reading the following detailed description and on examining the accompanying drawings, in which.

DETAILED DESCRIPTION

Figure 1:
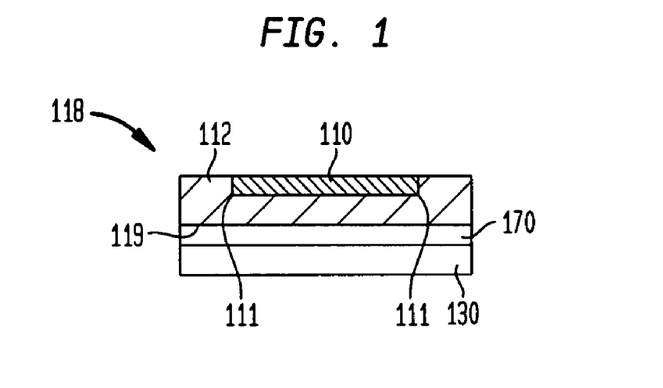
FIG. 1 is a sectional elevation view of an MRAM die according to an embodiment.
Figure 2:
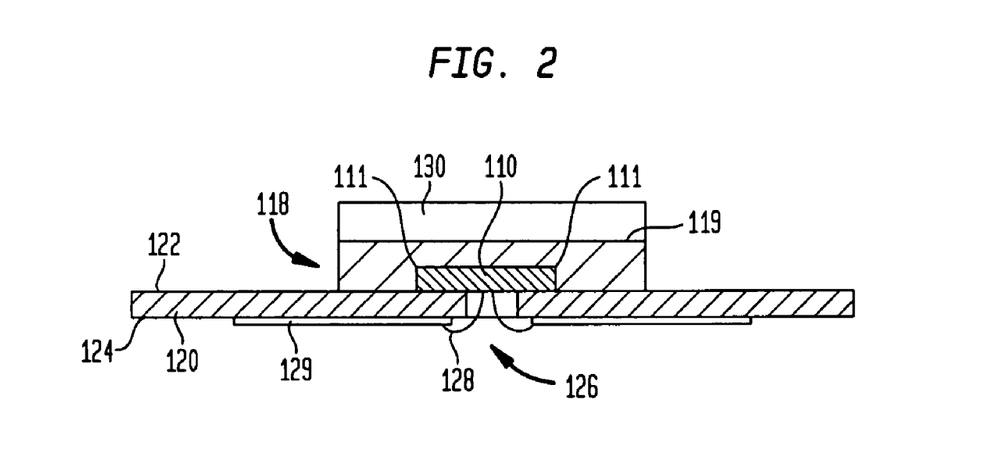
FIG. 2 is a sectional elevation view of a microelectronic package according to an embodiment.

Referring now to the drawings, wherein like reference numerals indicate like elements, FIG. 1 shows an MRAM die 118 including MRAM circuitry 110 within dielectric 112. As shown in FIG. 2, MRAM die 118 may be mounted to a substrate 120 which made from a dielectric material and is generally planar having a first surface 122 and a second, opposite surface 124. MRAM die 118 can be mounted to substrate 120 using known methods for flip-chip bonding such that die 118, particularly MRAM circuitry 110 within die 118 is electronically interconnected with conductive elements 129 exposed at a surface of substrate 120. In the embodiment shown in FIGS. 2 and 3, hole 126 is formed within substrate 120 through which wires 128 pass. Wires 128 interconnect MRAM circuitry 110 with the conductive elements 129 of substrate 120.

Generally, materials having one of two different properties are useful to divert magnetic fields. One such material is ferromagnetic, the other being diamagnetic. While both types of materials serve the purpose of deflecting magnetic fields, the way in which they carry out this purpose varies significantly. Ferromagnetic materials essentially divert magnetic field lines by providing a path of a lower magnetic reluctance to the magnetic field as compared to the MRAM component. Materials having a low magnetic reluctance are also referred to as having a high magnetic susceptibility. Magnetic fields tend to favor a path of lower magnetic reluctance when passing from one pole to the other to the point where essentially the entire magnetic field will be diverted through such a path. This phenomenon is known as "shunting."

Referring to FIG. 2, a magnetic shield 130 is mounted to top surface 119 of MRAM die 118. Magnetic shield 130 of the current embodiment is made from a material possessing ferromagnetic properties, but having no permanent magnetic field of its own. Examples of such materials are iron, iron-cobalt and nickel-iron alloy. Suitable alloys are available under the brand names MOLY-PERMALLOY, ALLOY 42, SUPERMALLOY, METGLAS™ and MU-SHIELD™.

Magnetic shield 130 can be mounted, for example, using a suitable adhesive layer 170 (as shown in FIG. 1) or the like. Further, magnetic shield 130 should be sized to extend beyond the outer edges 111 of MRAM circuitry 110 in both the X- and Y-directions, that is, in the X-Y plane of die. It should be noted that, for most MRAM applications, it is only necessary to shield the MRAM circuitry 110 from fields which may be encountered along the plane formed by the die (described herein as lying along the X- and Y-axes of a coordinate system). This is because typically, most MRAM memory cells within the die are only sensitive to magnetic fields lying along the same plane.

With continued reference to FIGS. 1 and 2, magnetic shield 130 is selected and sized so that an appropriate amount of a magnetic field is diverted away from the MRAM circuitry 110. The amount of stray magnetic field that should be diverted will vary with the sensitivity of the MRAM components. MRAM cells have a predetermined sensitivity or threshold, which is, for example, the strength of a magnetic field necessary to change the polarity of the cell. Magnetic fields having a strength lower than this amount should not affect the data stored in an MRAM structure. However, a magnetic field having a strength above this amount can corrupt the data stored within an MRAM structure. As used herein the "magnetic efficiency" of a magnetic shield structure is used to refer to the percentage of a stray magnetic field encountering MRAM circuitry 110 which would, in the absence of the magnetic shield, pass through the MRAM circuitry 110, but is shunted away from MRAM die 110 by the shield structure 130. Based on the level of stray magnetic fields encountered in the environments in which most MRAM devices operate, it has been determined that a magnetic shield structure should generally have a magnetic efficiency of at least about 90% to 98%. Although, based on how the MRAM device is used, the materials involved, and other such factors, that efficiency may be higher or lower.

Figure 3:
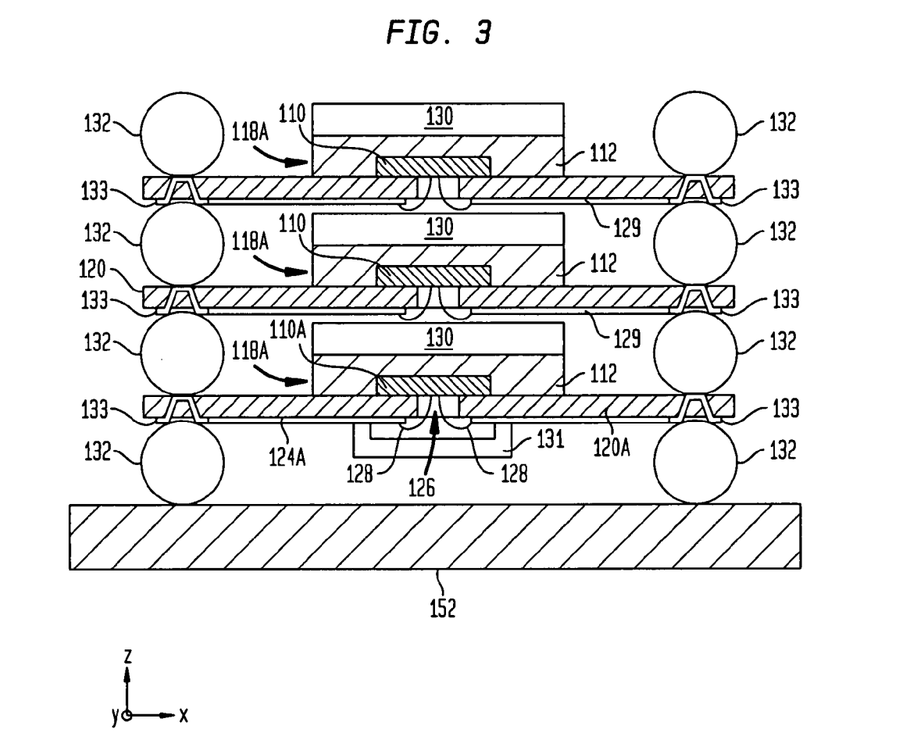
FIG. 3 is a sectional elevation view of a plurality of microelectronic packages according an embodiment.

The arrangements shown in FIGS. 2 and 3 provide a path of lower magnetic reluctance than that of the MRAM circuitry 110 and divert a stray magnetic field away from the MRAM circuitry 110. In order to provide greater protection for MRAM circuitry 110, while conserving space in a chip package including multiple MRAM dies 118A, a plurality of similar structures may be assembled in a stacked arrangement, as shown in FIG. 3. A stacked arrangement for die and substrate subassemblies is generally discussed commonly-owned U.S. Pat. No. 5,861,666, issued Jan. 19, 1999 to Bellaar ("the '666 patent"). In such an arrangement, at least two edges of the outer periphery of substrate 120 include metallic balls 132, which are preferably bonded to the first surface 122 of the substrate by solder. The diameter of each ball is approximately equal to or slightly greater than the combined thickness of MRAM die 118A and magnetic shield 130. The balls 132 are arranged in rows along the peripheral regions of the substrate 120 so that the balls 132 are disposed alongside the MRAM dies 118A. Balls 132 may be provided as conventional "solid core solder" balls. Thus, the balls 132 may initially have coatings of solder which are reflowed to bond the balls to the appropriate areas of substrate 120. Balls 132 may be electrically interconnected as between the subassemblies by including conductive vias 133 through substrates 120. Solder balls 132 can be used to supply power to the individual MRAM dies 118A or can be connected to the magnetic shield to conduct heat away from dies 118, 118A or to provide a grounding plane for dies 118, 118A. Further, solder balls 132 can be replaced with conductive pins or posts.

Figure 4:
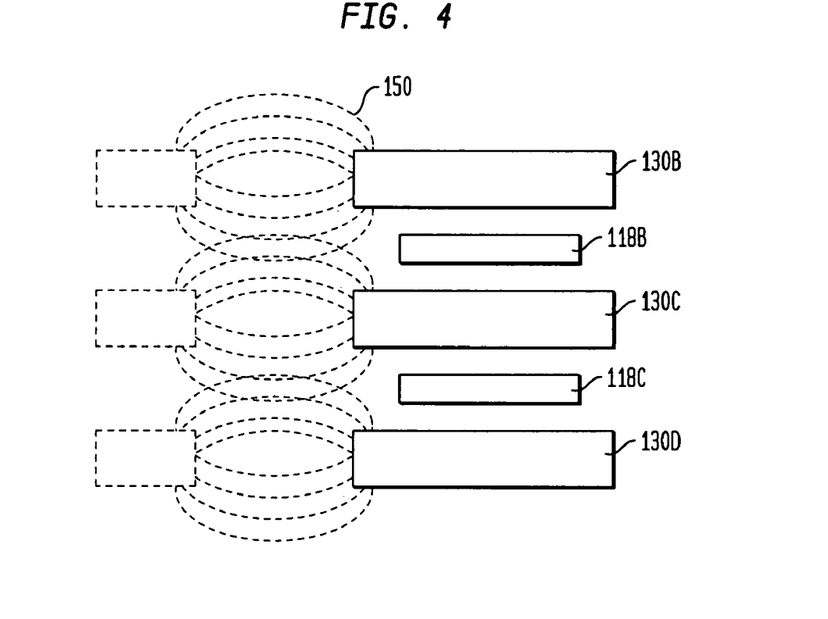
FIG. 4 is an exemplary illustration sectional view of the diversion of magnetic field lines through a magnetically preferred path according to an embodiment.

This stacked arrangement results in most of the MRAM dies 118A, including MRAM circuitry 110 and dielectric 112, having a shield 130 disposed both above and below them, providing two paths around which stray magnetic fields may be diverted. An example of this effect is shown in FIG. 4, wherein MRAM dies 118B and 118C each have a shield disposed adjacent to and in parallel relationship with both the upper and lower sides thereof. Shields 130B and 130C are disposed adjacent to MRAM die 118B and shields 130C and 130D are disposed adjacent to MRAM die 118C. Stray magnetic fields as illustrated by lines 150 are diverted through magnetic shields 130B, 130C and 130D and do not encounter MRAM dies 118B and 118C in an amount outside of a generally acceptable range. As shown in FIG. 3, the stacked arrangement only provides for one shield 130 disposed adjacent to lowermost MRAM circuitry 110A. Accordingly, an additional shield 131 may be mounted to bottom surface 124A of substrate 120A. Such a shield can be adapted to allow for any necessary electrical connections between MRAM die 110A and substrate 120A. Additionally, the subassembly may be mounted to a printed circuit board 152 or similar structure as shown in FIG. 3. Alternative methods may be used to mount MRAM dies 118A to substrates 120 and may include any methods of flip-chip or face up bonding. The specific attachment of shield 130 to the structure may vary accordingly and may include any form of attachment to any feature which results in the appropriate arrangement of shields with respect to MRAM dies 118A. In such an arrangement wherein a number, N, of MRAM dies 118A are arranged in stacked fashion, the structure should include N+1 magnetic shields 130. Further, each MRAM die 118A should have one shield 130 disposed above it, and one shield 130, 131 disposed below it.

Figure 5:
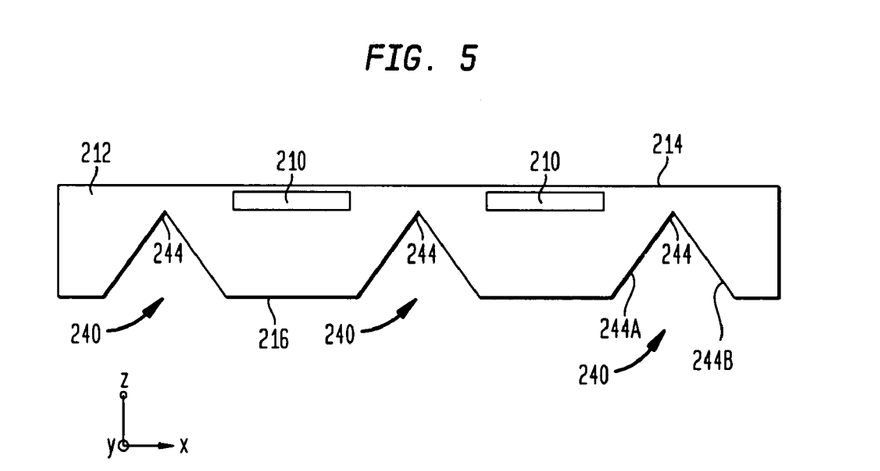
FIG. 5 is an elevation view of a wafer during a stage of a process according to an embodiment.

In an alternative embodiment, referring to FIG. 5, wafer 212 including a plurality of MRAM circuitry groups 210 similar in structure to MRAM circuitry 110 discussed with reference to FIGS. 1-3. Wafer 212 is preferably made from silicon or another suitable dielectric material. As shown in FIG. 5, the MRAM circuitry groups 210 are arranged in an array in the X-direction. Similarly, MRAM circuitry groups 210 can further be arranged to extend in the Y-direction or Z-direction. Wafer 212 can be thinned, if necessary, to the desired thickness. Wafer 212 can be etched to form trenches 240 in second surface 216 of the wafer 212. Trenches 240 are preferably formed in both the X- and Y-directions so that MRAM circuitry assemblies 210 are located between trenches or within a rectangle formed by an intersection of trenches 240 in the X- and Y-directions. Trenches 240 are preferably formed by etching, which may be done using mechanical processes or by using a chemical etchant. Trenches 240 may have two side walls 244A and 244B, which are spaced apart near second surface 216 of wafer 212 and which intersect at a point 244 within the body of wafer 212 near the first surface 214 as shown in FIG. 6.

Figure 6:
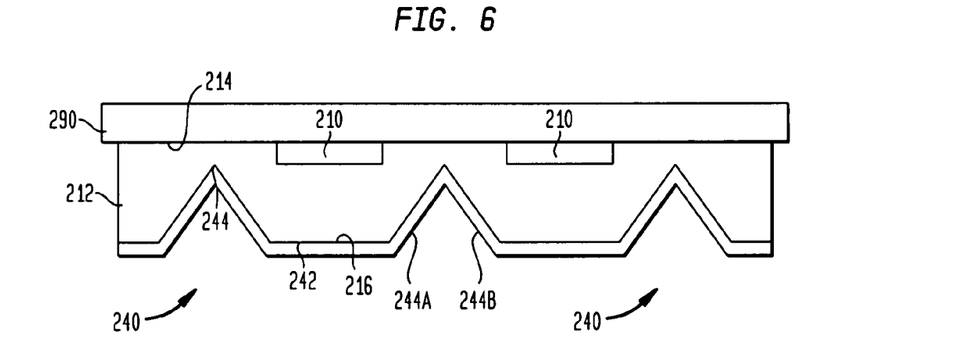
FIG. 6 is an elevation view of a wafer as shown in FIG. 5 at a later stage of the process according to an embodiment.

Referring to FIG. 6, once trenches 240 are formed, a magnetic shield layer 242 is formed on the second surface 216 of wafer 212. Preferably, magnetic shield layer 242 is formed by methods including sputtering, electroplating, electroless-plating, chemical vapor disposition, and evaporation. Such processes are useful in order to conform magnetic shield layer 242 to the topography of second surface 216, including trenches 240 and surfaces 244A, 244B. Suitable materials for formation of magnetic shield layer 242 include the iron, iron-cobalt alloys and iron-nickel alloys as discussed above. Generally, the thickness of magnetic shield layer 242 will vary with the sensitivity of the cells which are part of MRAM circuitry groups 210 as well as with the particular materials used. Magnetic shield 290 overlies first surface 214 of wafer 212 thus ensuring there is a magnetic shield disposed both above and below MRAM circuitry groups 210.

Figure 7:
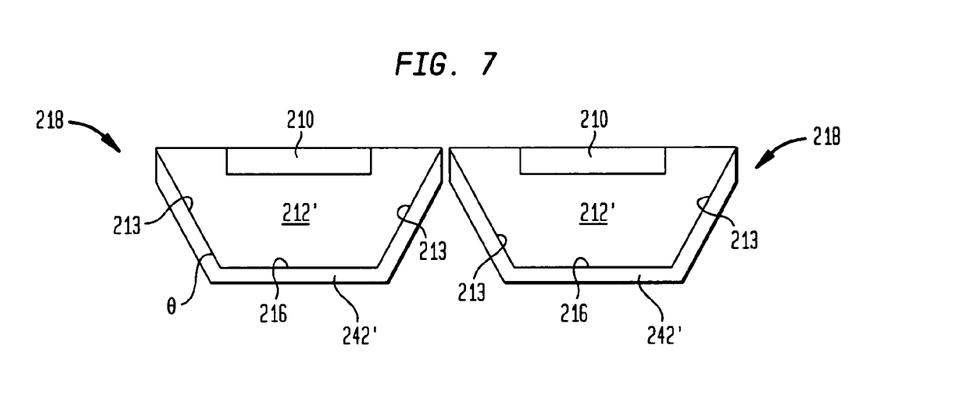
FIG. 7 is an elevation view of singulated wafers at a different stage of the process according to an embodiment.

As shown in FIG. 7, after formation of magnetic shield layer 242 on second surface 216 of wafer 212, wafer 212 is singulated into individual dies 218. Each die 218 preferably including a single MRAM circuitry group 210 in a dielectric material 212' having four angled side walls 213 and a top wall 216. A magnetic shield 242' preferably covers at least a portion of side walls 213 and all of top wall 216. Magnetic shield 242' preferably forms a contiguous structure to provide an uninterrupted path though which stray magnetic fields are directed. Although, side walls 213 may be substantially orthogonal to top wall 216, it is preferred that side walls 213 form an oblique angle θ with respect to top wall 216.

Figure 8:
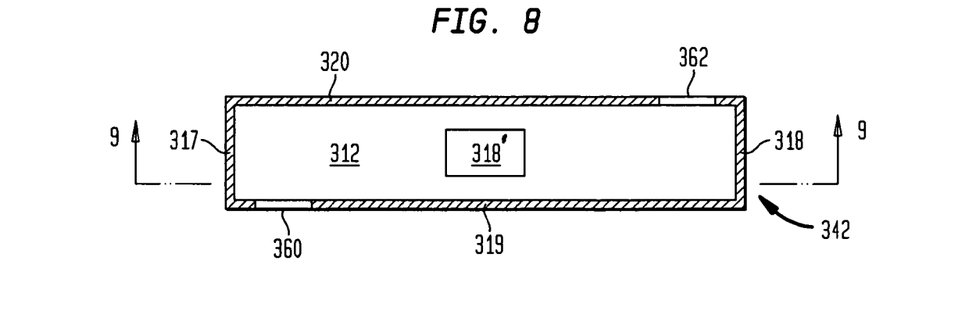
FIG. 8 is a top sectional view of a microelectronic package within a magnetic shield structure according to an embodiment.
Figure 9:
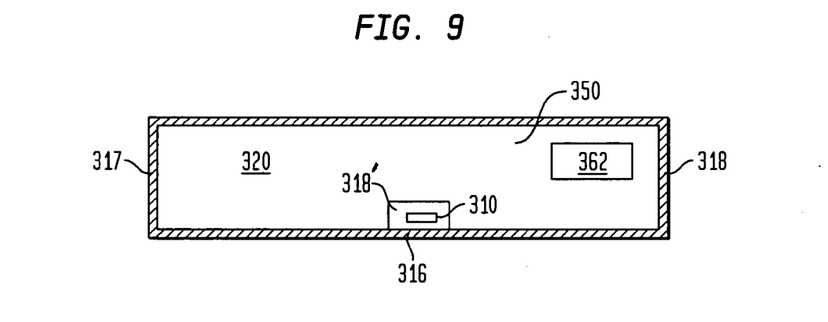
FIG. 9 is a side sectional view of the microelectronic package as shown in FIG. 8 according to an embodiment.
Figure 10:
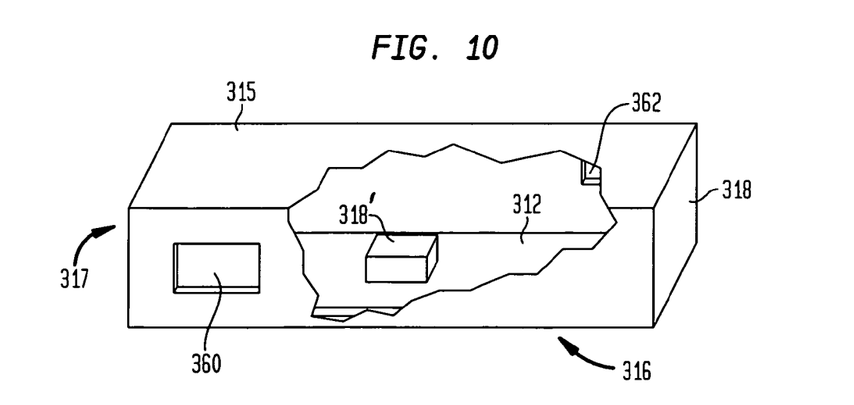
FIG. 10 is an isometric view of the microelectronic package as shown in FIGS. 8 and 9 according to an embodiment.

A further embodiment is shown in FIGS. 8-10, wherein MRAM die 318' having MRAM circuitry 310 therein is assembled on a substrate 312, which is contained within a magnetic shield structure 342. Magnetic shield structure 342 includes top wall 315, bottom wall 316, left wall 317, right wall 318, front wall 319 and rear wall 320. As used herein the terms top, bottom, left, right, front and rear are used only to refer to the geometric frame of reference as illustrated in the Figures, and are not intended to limit the scope of the invention disclosed herein. In the embodiment depicted in FIGS. 8-10, walls 315-320 form a box-like structure in the form of a rectangular prism with an internal compartment 350 on the interior thereof. Die 318' is contained within shield structure 342 and is preferably mounted therein. This can be accomplished by securing die 318' to, for example, bottom wall 316, which may be done using an adhesive or other known means.

Top, bottom, left, and right walls 315-318 are preferably solid. Front and back walls 319, 320 each include a hole 360, 362, respectively, formed therein. Holes 360, 362 are formed in front and back walls 319, 320 so as to allow access to MRAM die 318' for making an electronic connection therewith, for example by attachment of a lead thereto, while preventing harmful levels of magnetic fields from reaching MRAM die 318'. Holes 360, 362 may be arranged with respect to both MRAM die 318' and each other such that there is no line-of-sight from one hole to the other passing through interior compartment 350 of shield structure 342. Such an arrangement for holes 360, 362 functions to prevent harmful levels of stray magnetic fields from reaching MRAM die 318' contained within shield structure 342. The arrangement of holes 360, 362 in front and back walls 319, 320 will vary with the thickness of front and back walls 319, 320 and with respect to the size of both holes 360, 362 and the overall size of MRAM die 318'.

Figure 11:
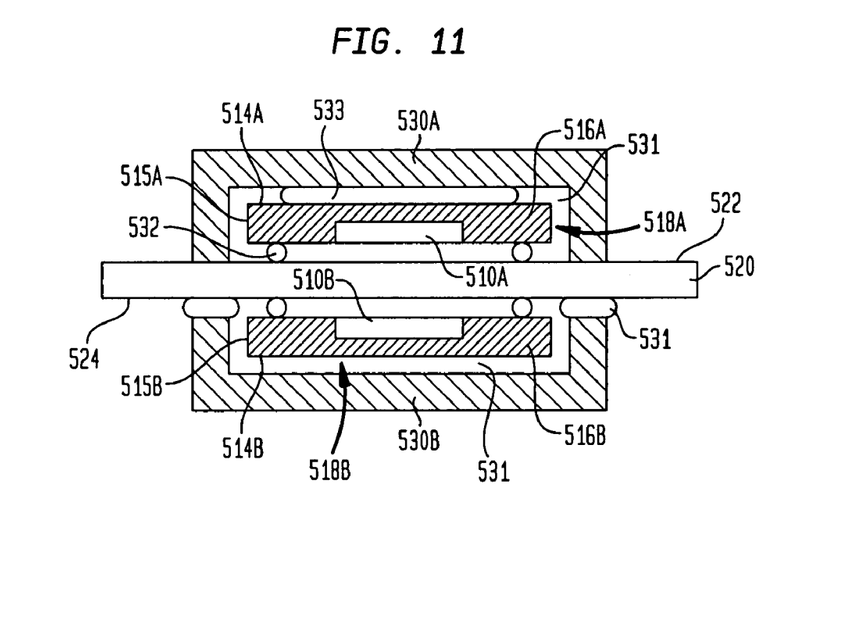
FIG. 11 is an elevation view of a microelectronic package including magnetic shields according to an embodiment.
Figure 12:
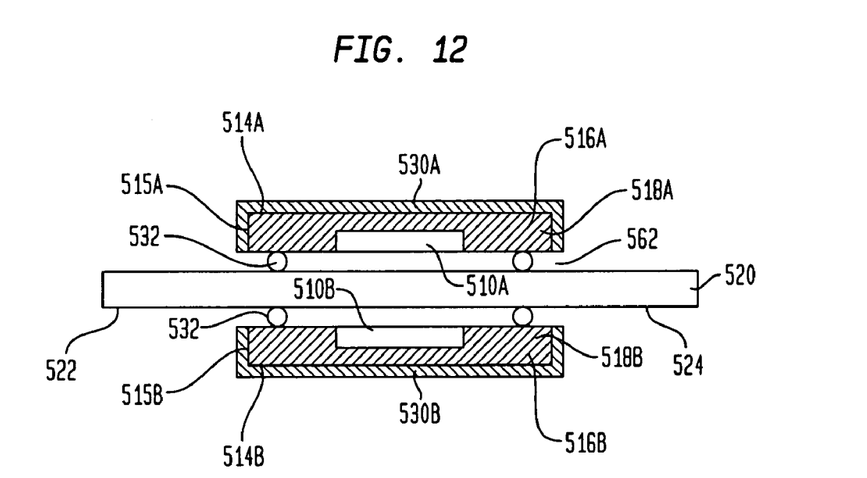
FIG. 12 is an elevation view of a microelectronic package including magnetic shields according to an embodiment.

A further embodiment is shown in FIGS. 11 and 12. Referring to FIG. 11, two MRAM dies 518A, 518B, each including MRAM circuitry 510A, 510B embedded within a dielectric 516A, 516B. Each of the two dies 518A, 518B are mounted, preferably in flip-chip configuration, to a substrate 520 having a first face 522 and a second face 524. Preferably, dies 518A, 518B are positioned in alignment with one another such that die 518A is directly above die 518B. MRAM circuitry 510A, 510B may be interconnected to substrate 520, either directly through electronically conductive elements 532 or through electronically conductive elements (not shown) formed in the dielectric 516A, 516B.

Magnetic shields 530A, 530B, are positioned to cover at least the outside surfaces 514A, 514B of dies 518A, 518B, respectively. Preferably, magnetic shields 530A, 530B extend toward substrate 520 to cover the sides 515A, 515B of dies 518A, 518B, as shown in FIGS. 11 and 12. As shown in FIG. 11, magnetic shield can be formed from a plate with a recess 531 opened to a side thereof. Magnetic shield 530A, 530B is placed over die 518A, 518B such that die 518A, 518B is disposed substantially within recess 531. Magnetic shield 530A, 530B can be mounted to the outside surface 514A, 514B of die 518A, 518B, or to the surface 522,524 of the substrate 520, or to both. This can be done, by way of example, using any form of acceptable adhesive 533 or other known methods. Alternatively, as shown in FIG. 12, magnetic shield 530A, 530B can be formed directly on die 518A, 518B by any one of the process described with respect to FIGS. 5-7.

By positioning the dies 518A, 518B and the corresponding magnetic shields 530A, 530B on opposite sides of substrate 520 in the substantially aligned arrangement shown in FIGS. 11 and 12, a structure is provided in which the two MRAM circuitry assemblies 510A, 510B are nearly continuously surrounded by a magnetic shield 530A, 530B. In both arrangements shown, the magnetic shield 530A, 530B effectively provides shielding for each of the two dies 518A, 518B independently, protecting the MRAM circuitry from stray magnetic fields that may be present on all sides thereof. The portion of the nearly continuous shield which may be left open is the thickness of the substrate 520, and any gap 562 formed as shown in FIG. 12, either where an adhesive layer (not shown) may be placed between the substrate 520 and the shield 530A, 530B or where the conductive elements 532 used in flip-chip bonding space apart the die 518A, 518B from the substrate 520.

Figure 13:
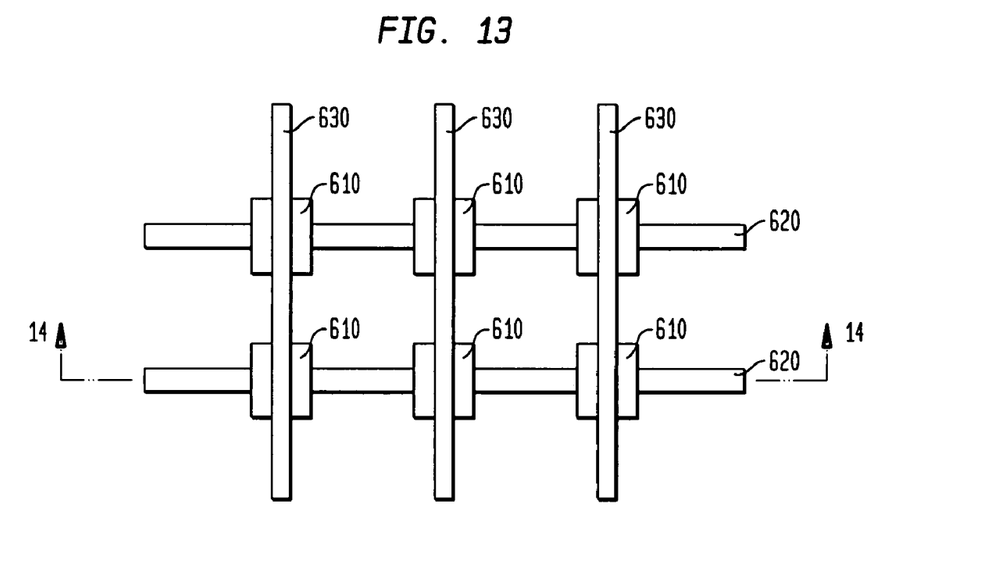
FIG. 13 is a top elevation view of a portion of MRAM circuitry including magnetic shielding according to an embodiment.
Figure 14:
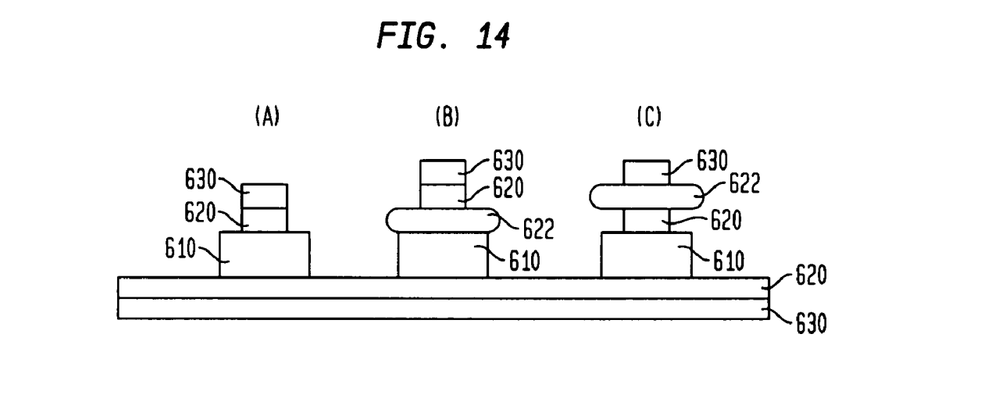
FIG. 14 is a side section view of the MRAM structure shown in FIG. 13 according to an embodiment.

Referring to FIGS. 13 and 14 a portion of circuitry used in an MRAM structure is shown which incorporates magnetic shielding into the individual memory cells. In this embodiment, MRAM cells 610 are provided in an array. Traces 620 corresponding to various rows and columns pass over and/or under the MRAM cells 610 and are used to write data into the MRAM device according to known methods of operation. A magnetic shield 630 is applied on the outside surface of the individual traces 620 as shown in FIG. 14 (A). The magnetic shield may be in the form of a coating. The array of magnetic shield elements created by using such an arrangement protects the individual MRAM cells 610 on both sides from stray magnetic fields in both the X- and Y-directions by forming a "mesh" or "cage" of shielding. The magnetic shields 630 may be made from any of the materials which have been previously discussed and should be constructed to provide a magnetic shielding efficiency in the range of at least 90% to 98%. Additionally, the MRAM structure can include insulating layers 622 either between MRAM cells 610 and traces 620 as shown in FIG. 14 (B) or between traces 620 and magnetic shields 630 as shown in FIG. 14 (C).

Figure 15:
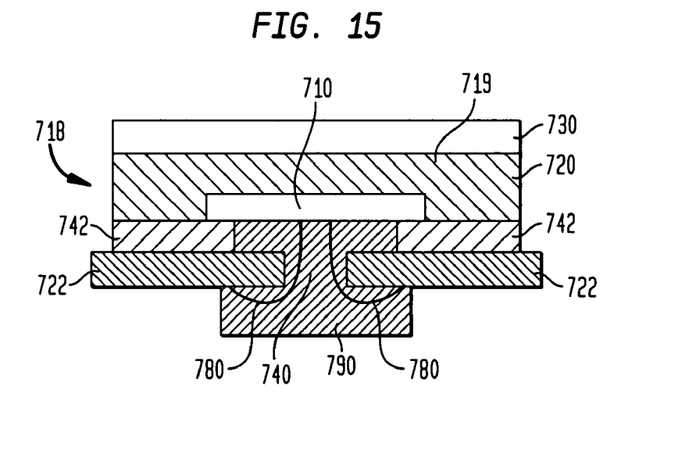
FIG. 15 is a side elevation view of a microelectronic package including a magnetic shield according to an embodiment.
Figure 16:
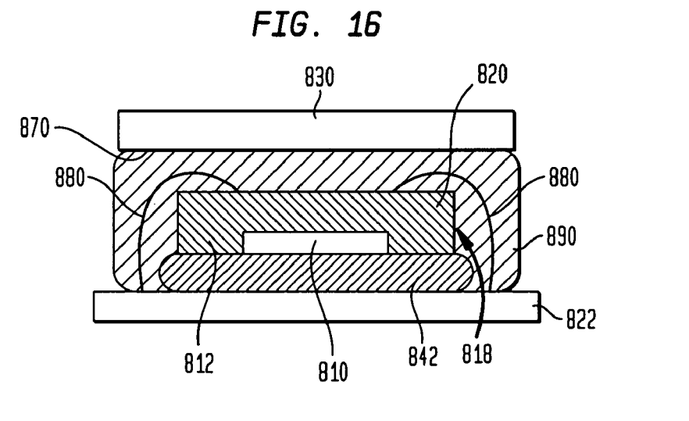
FIG. 16 is a side elevation view of a microelectronic package including a magnetic shield according to an embodiment.
Figure 17:
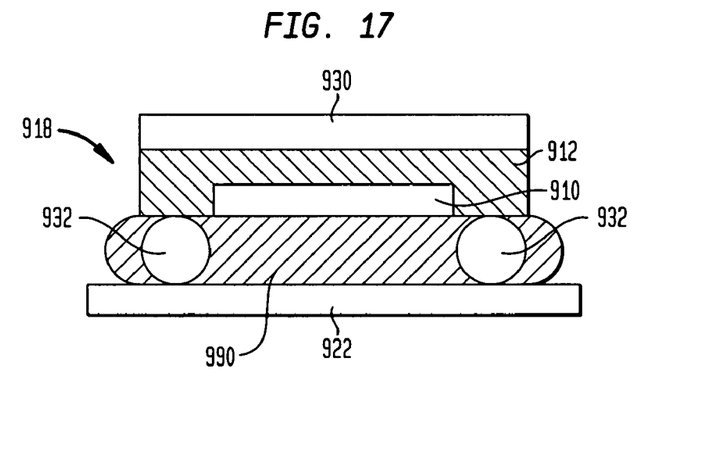
FIG. 17 is a side elevation view of a microelectronic package including a magnetic shield according to an embodiment.

As shown in FIGS. 15-17, an MRAM die 718, 818, 918 can be shielded by various structures utilizing a polymeric compound 790, 890, 990 having ferromagnetic particles embedded therein. Such a compound can be used to provide additional shielding for magnetic shields 730, 830 and 930, as shown in FIGS. 15-17, which may be omitted. Similarly, the various embodiments discussed in FIGS. 15-17 can be used for additional shielding in applications using the embodiments discussed with reference to FIGS. 1-12. FIG. 15 shows such a compound a polymeric compound having ferromagnetic particles in the form of an encapsulant 790 used to fill an opening 740 formed in substrate 722 through which wires 780 pass in order to electronically interconnect MRAM circuitry 710 to traces or the like (not shown) formed in substrate 722. As further shown in FIG. 15, an adhesive layer 742 can be used to attach MRAM die 718 to substrate 722 to provide additional magnetic shielding by including ferromagnetic particles therein. Additionally, magnetic shield plate 730 mounted to an upwardly-facing surface 719 of die 718 can be omitted from the structure, should the magnetic shielding efficiency of the compound be sufficient.

FIG. 16 shows an alternative arrangement employing polymeric compounds with embedded ferromagnetic particles to provide magnetic shielding for MRAM circuitry 810. MRAM die 818 is in the form of a dielectric 812 having MRAM circuitry 810 embedded therein. Die 818 is mounted to substrate 822 using an adhesive layer 842 with ferromagnetic particles contained therein. MRAM circuitry 810 is electronically connected to contact pads (not shown) on substrate 822 using wires 880. An encapsulant 890 having ferromagnetic particles contained therein is applied to cover die 818 and wires 880. Magnetic shield 830, which is shown in FIG. 16 as being mounted on the top surface 870 of encapsulant 890 can, optionally, be omitted.

FIG. 17 shows a further alternative arrangement employing an underfill layer 990 having ferromagnetic particles contained therein to provide magnetic shielding. In this arrangement, die 918 having a dielectric layer 912 with MRAM die 910 exposed at a face thereof is bonded in a flip-chip configuration to substrate 922 with balls 932. Underfill layer 990 is injected between die 918 and substrate 922 and provides a magnetically-preferred path through which stray magnetic fields pass. Magnetic shield 930, mounted to the top surface of MRAM die 918 may, optionally, be omitted.

Adhesives, encapsulants and underfill layers are generally used in chip packaging structures and are known in the art. These components are typically made from polymeric, dielectric materials. By incorporating ferromagnetic particles into these polymeric compounds, useful magnetic shielding materials are produced. Such ferromagnetic compounds can include various ferrous alloys including iron-nickel mixtures. Materials such as those discussed with respect to previous embodiments can be processed, for example by grinding, to achieve the desired particle size for use in such structures. The ferromagnetic particles used in this embodiment should be sufficient in quantity and density with respect to the compound in which they are embedded such that a magnetically preferred path is provided. However, as many ferromagnetic particles are electrically conductive, the density should not be so great that an electrical path is provided as such can cause short-circuiting and damage to the components used in connection therewith. In one embodiment, the average size of the particles in such a compound is between 1-50 microns. Additionally, to further reduce the likelihood that the ferromagnetic particles in such a compound form an electrically conductive path, the ferromagnetic particles can be coated with a dielectric material.

Figure 18:
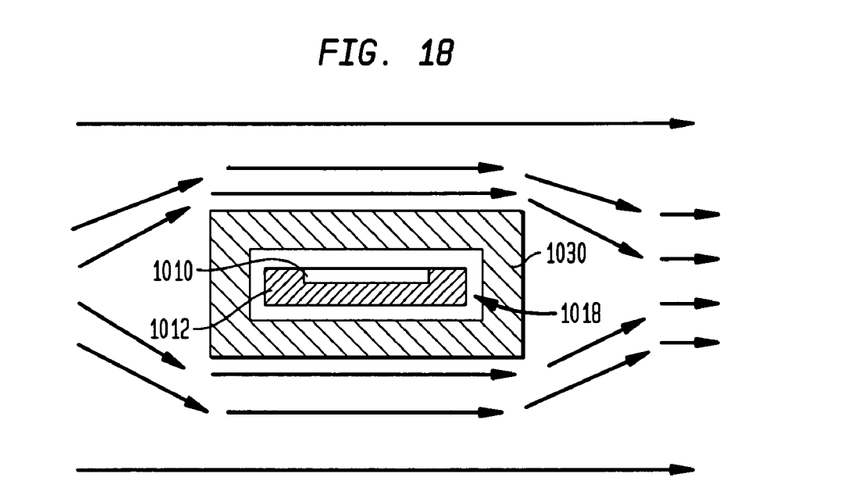
FIG. 18 is a side cross sectional view of a microelectronic MRAM die including a magnetic shield according to an embodiment.

FIG. 18 illustrates the use of a diamagnetic material as a magnetic shield. Diamagnetism, is a property that is typically only observable in materials without ferromagnetic properties. Diamagnetic materials are materials that only exhibit magnetic properties in the presence of a magnetic field. However, most of these materials exhibit only weak magnetic properties. Generally, diamagnetic materials are repelled by magnetic fields or, in other words, magnetic fields are repelled by diamagnetic materials. All materials, including ferromagnetic materials exhibit some diamagnetic properties; however, such properties are generally too weak to be perceived or to overcome ferromagnetic properties which may also be present. Some materials, such as bismuth can exhibit strong diamagnetic properties. Pure forms of graphite, such as pyrolitic graphite can exhibit even stronger diamagnetic properties in a single plane. The tendency of a material to exhibit diamagnetic properties is known as magnetic susceptibility. The magnetic susceptibility of water, for example, is about $-9\times10^{-6}$, while the magnetic susceptibility of bismuth is about $-166\times10^{-6}$. The single-plane magnetic susceptibility of pyrolitic graphite is about $-400\times10^{-6}$. Additionally, superconductors may exhibit diamagnetism.

As opposed to a ferromagnetic material, a diamagnetic material is used as a magnetic shield by deflecting magnetic fields away from the shield, rather than directing magnetic fields through the shield by providing a magnetically preferred path. Thus, as shown in FIG. 18, magnetic shield 1030, which is formed from a diamagnetic material, surrounds die 1018 substantially on all sides. Small holes (not shown) can be formed in shield 1030, but should be no larger than necessary to form any electronic connection with MRAM circuitry 1010 within dielectric 1012. The arrows in FIG. 18 indicate the preferred magnetic path around rather than through the diamagnetic shield 1030.

Figure 19:
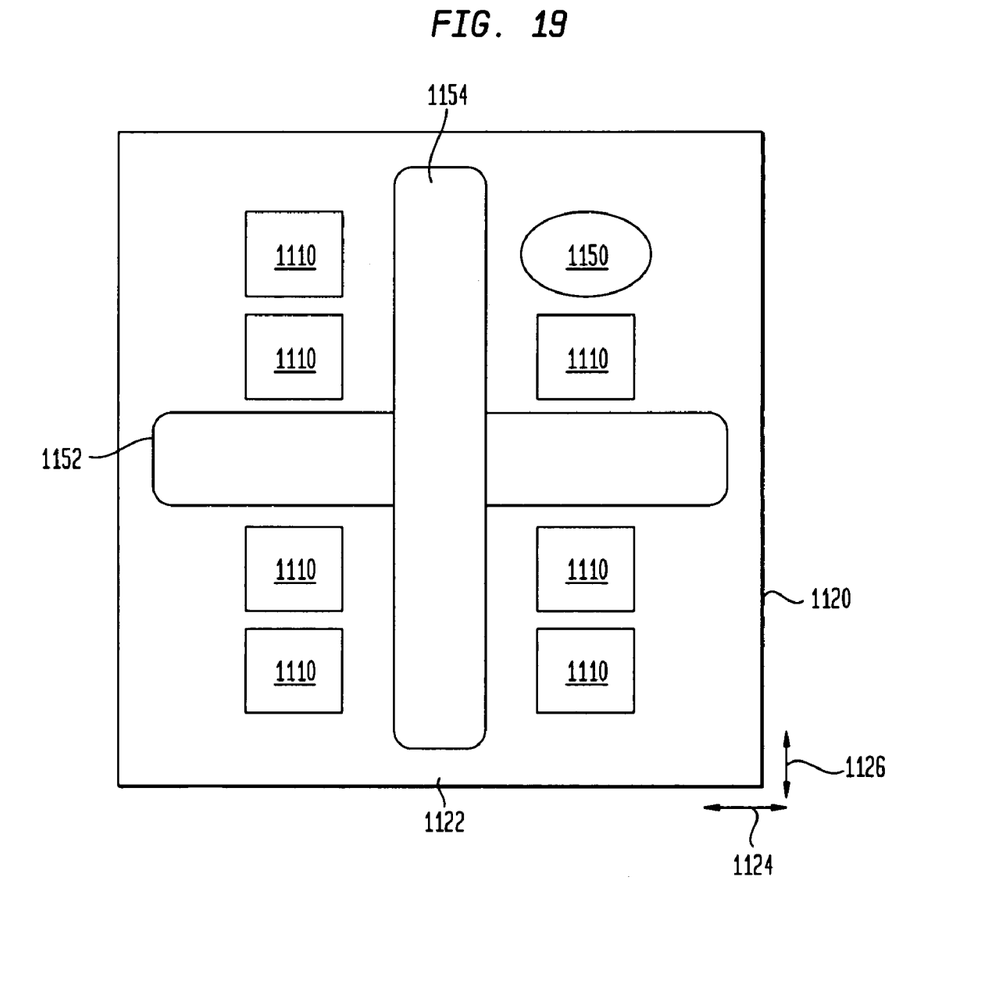
FIG. 19 is a top elevation view of a microelectronic assembly including a magnetic shielding device according to an embodiment.

FIG. 19 shows a magnetic shielding device that uses electromagnetic coils to neutralize stray magnetic fields near an MRAM device. As shown in FIG. 19, a magnetic field sensor 1150 is mounted to or incorporated in substrate 1120, to which one or more MRAM dies 1110 are conductively connected. The substrate has face 1122 extending in first and second directions 1124, 1126 which define an X-Y plane. Magnetic field sensors are generally known in the art and include hall-effect devices and other similar devices. The magnetic field sensor 1150 supplies data relating to the strength and direction of a magnetic field to a set of two electromagnetic coils 1152, 1154. A first electromagnetic coil 1152 is oriented in the first direction 1124, and a second electromagnetic coil 1154 is oriented the second direction 1126 transverse to the first direction 1124. Although the electromagnetic coils 1152, 1154 are shown extending in directions 1124, 1126 which are substantially perpendicular, in one embodiment the directions 1124, 1126 need only be transverse to each other. The directions can be the same directions in which a major surface of each MRAM die extends as mounted to the substrate. MRAM dies are typically only sensitive to interference from magnetic fields in the directions of the read/write traces, which lie in the X-Y plane of the substrate face 1122. If necessary, a corresponding coil (not shown) oriented in the Z-direction, which is perpendicular to the X-Y plane, can be used. In the present embodiment, the magnetic sensor 1150 can include control circuitry, which receives the magnetic field data and generates signals for operating the coils 1152, 1154 to generate a sufficient opposite magnetic field in the X-Y plane of substrate face 1122. The opposite magnetic field results in a net magnetic field strength near zero in the X-Y plane of the substrate face 1122, thereby protecting the data stored in the MRAM dies 1110 from being changed or damaged by magnetic fields.

Although the invention herein has been described with reference to particular embodiments, it is to be understood that these embodiments are merely illustrative of the principles and applications. It is therefore to be understood that numerous modifications may be made to the illustrative embodiments and that other arrangements may be devised without departing from the spirit and scope. Thus, the foregoing description of the preferred embodiments should be taken by way of illustration rather than by way of limitation of the invention as defined by the claims.

The invention claimed is:

1. A microelectronic component, comprising:
   a first die having top and bottom surfaces and edges extending between the top and bottom surfaces defining an outer periphery, the die including MRAM circuitry;
   a first magnetic shield overlying the top surface of the first die, the first magnetic shield having a top surface facing away from the die;
   a second magnetic shield overlying the bottom surface;
   a second die having top and bottom surfaces and including MRAM circuitry; the second die overlying the top surface of the first magnetic shield; and
   a third magnetic shield overlying the top surface of the second die,
   wherein at least one of the first and second magnetic shields includes a ferromagnetic material.

2. The microelectronic component as claimed in claim 1 wherein the first and second magnetic shields extend beyond the outer periphery of the first die.

3. The microelectronic component as claimed in claim 1, wherein at least one of the first and second magnetic shields has edges disposed beyond each of the edges of the first die.

4. The microelectronic component as claimed in claim 1, the microelectronic component further comprising a third die including MRAM circuitry overlying the top surface of the third magnetic shield, the third die having top and bottom surfaces and edges extending between the top and bottom surfaces defining an outer periphery, and a fourth magnetic shield overlying the third die and the top surface of the third magnetic shield, wherein the fourth magnetic shield extends beyond the outer periphery of the third die.

5. The microelectronic component as claimed in claim 1, wherein the first and second magnetic shields extend beyond an outer periphery of the MRAM circuitry.

6. The microelectronic component as claimed in claim 1, wherein the MRAM circuitry has edges defining the outer periphery of the MRAM circuitry and at least one of the first and second magnetic shields has edges disposed beyond each of the edges of the MRAM circuitry.

7. The microelectronic component as claimed in claim 1, wherein the ferromagnetic material includes at least one metal selected from the group consisting of iron, nickel and cobalt.

8. The microelectronic component as claimed in claim 1, wherein the ferromagnetic material has a magnetic reluctance that is less than a magnetic reluctance of the die.

9. The microelectronic component as claimed in claim 1, wherein at least one of the first and second magnetic shields includes a diamagnetic material.

10. The microelectronic component as claimed in claim 9, the diamagnetic material selected from the group consisting of bismuth and pyrolitic graphite.

11. The microelectronic component as claimed in claim 1, wherein at least one of the first and second magnetic shields includes a polymeric material applied to a portion of the microelectronic component, the polymeric material containing a plurality of ferromagnetic particles interspersed therein.

12. The microelectronic component as claimed in claim 1, wherein the first magnetic shield defines a first major wall of a magnetic shielding enclosure, the second magnetic shield defines a second major wall of the magnetic shielding enclosure, the magnetic shielding enclosure further comprising a plurality of minor walls extending between the first and second major walls so as to define an aperture, wherein the die is disposed within the aperture.

13. The microelectronic component as claimed in claim 1 further including a substrate having a first face mounted to the top surface of the first die, wherein the first magnetic shield overlies the substrate.

14. The microelectronic element of claim 13, wherein the second magnetic shield has a first length that differs from a second length of the first magnetic shield.

15. The microelectronic assembly of claim 14, wherein the second length is smaller than the first length.

16. The microelectronic component as claimed in claim 1, wherein at least one of the first and second magnetic shields is mounted to at least one of the first and second die.

17. The microelectronic component as claimed in claim 1, wherein the bottom surface of the second die is disposed adjacent to the first magnetic shield such that the first magnetic shield is the only magnetic shield disposed between the top surface of the first die and the bottom surface of the second die.

18. The microelectronic component as claimed in claim 1, wherein the first die is mounted to a first surface of a substrate having a hole such that the MRAM circuitry electrically of the first die is connected through the hole to a conductive element on a second surface of the substrate.

19. The microelectronic component as claimed in claim 18, wherein a plurality of wires electrically connect the MRAM circuitry with a plurality of the conductive elements on the substrate.

20. The microelectronic component as claimed in claim 18, wherein the hole is located substantially in the center of the substrate.

21. The microelectronic element of claim 1, wherein the second magnetic shield has a first length that differs from a second length of the first magnetic shield.

22. A microelectronic component, comprising:
a die having top and bottom surfaces and edge surfaces extending between the top and bottom surfaces defining an outer periphery, the die including MRAM circuitry;
a first magnetic shield overlying the top surface,
a second magnetic shield overlying the bottom surface;
wherein at least one of the edge surfaces is canted at a non-right angle away from the bottom surface, wherein the second magnetic shield extends along the bottom surface and onto the at least one edge surface.

23. The microelectronic component as claimed in claim 22, wherein the second magnetic shield is formed by at least one of sputtering, electroplating, electroless-plating, chemical vapor disposition, or evaporation.

24. A microelectronic assembly, comprising:
a plurality of microelectronic subassemblies, each including:
a die having a first face, a second face remote from the first face and MRAM circuitry embedded therein;
a magnetic shield including a ferromagnetic material mounted to the first face of the die adapted to divert a stray magnetic field away from the MRAM circuitry;
a plurality of conductive support elements supporting the plurality of microelectronic subassemblies in stacked relation to each other so that the dies overlie one another.

25. The microelectronic assembly as claimed in claim 24, further comprising a second magnetic shield mounted to one of the dies at an open end of the stacked microelectronic subassemblies.

26. The microelectronic assembly as claimed in claim 24, wherein the support elements include at least one of solder balls, conductive pins, or conductive posts.

27. The microelectronic assembly as claimed in claim 26, wherein the support elements include solder balls and the solder balls have a diameter at least as large as a thickness of the die and a thickness of the magnetic shield combined.

\* \* \* \* \*